United States Patent [19] [11] 3,714,539
Hampl, Jr. [45] Jan. 30, 1973

[54] PRESSURE-CONTACT STRUCTURE FOR THERMOELECTRIC GENERATORS

[75] Inventor: Edward F. Hampl, Jr., St. Paul, Minn.

[73] Assignee: Minnesota Mining and Manufacturing, St. Paul, Minn.

[22] Filed: June 24, 1971

[21] Appl. No.: 156,193

[52] U.S. Cl. ..........................321/1.5, 136/221, 62/3
[51] Int. Cl. ..........................................H02m
[58] Field of Search ................310/4; 321/1.5; 322/2; 324/104, 105; 136/212, 221; 62/3

[56] References Cited

UNITED STATES PATENTS

| | | | |
|---|---|---|---|
| 2,258,809 | 10/1941 | Rabezzana | 136/221 |
| 3,617,390 | 11/1971 | De Bucs et al. | 136/221 |
| 3,377,206 | 4/1968 | Hanlein et al. | 136/221 X |
| 3,451,858 | 6/1969 | Dingwall | 136/221 X |

*Primary Examiner*—William M. Shoop, Jr.
*Attorney*—Kinney, Alexander, Sell, Steldt & Delahunt

[57] ABSTRACT

Pressure-contact thermoelectric converters in which rectangular followers applying longitudinal pressure on thermoelectric legs are also biased laterally against walls defining recesses in which the followers slide. More than one follower may be in each recess to improve the compactness of the converters.

7 Claims, 4 Drawing Figures

PATENTED JAN 30 1973

3,714,539

INVENTOR.
EDWARD F. HAMPL JR.
BY Kinney, Alexander,
Sell, Steldt & DeLaHunt
ATTORNEYS

PRESSURE-CONTACT STRUCTURE FOR THERMOELECTRIC GENERATORS

BACKGROUND OF THE INVENTION

In "pressure-contact" thermoelectric converters, in which thermoelectric legs are held in longitudinal compression between hot-junction and cold-junction electrodes, the pressure is generally developed by a spring acting through a follower coaxially aligned with the cold end of the leg. The cold-end follower is slidably mounted in a recess in the heat-dissipating member of the converter, and the spring is generally a coil spring in compression between the bottom of the follower and the bottom wall of the recess. Beside applying pressure, the follower may act as the cold-junction electrode or such an electrode may be disposed between the follower and leg, and, in addition, heat traveling through the leg is conducted through the follower to the heat-dissipating member.

One problem inhibiting perfection of pressure-contact thermoelectric generators is the fact that the conduction of heat through a follower to a heat-dissipating member is often less than needed to maintain the cold end of the leg at a desired low temperature. In typical prior-art constructions, the followers have been cylindrical and have been mounted in cylindrical recesses that were slightly larger than the follower. Thus, the direct contact between the follower and heat-dissipating member may be only a line contact, greatly reducing the conduction of heat and causing the cold-end temperature of the leg to be too high for optimum use of the leg.

SUMMARY OF THE INVENTION

The present invention avoids the problems stated above and at the same time provides a more compact thermoelectric converter. A thermoelectric converter of the invention (thermoelectric power generating devices or thermoelectric cooling devices) includes the usual heat-absorbing and heat-dissipating members in generally parallel spaced relationship, with an array of thermoelectric legs disposed between them. Hot- and cold-junction means thermally connect the legs to, while electrically insulating them from, the heat-absorbing and heat-dissipating members, and electrically connect the legs to accumulate the electric potential developed in the legs.

A converter of the invention is characterized in that the cold-junction means for at least one leg includes, briefly, a. a recess in the heat-dissipating member having a first substantially flat side surface that is parallel to the longitudinal axis of the leg, b. a follower member that (i) is slidably mounted in the recess for movement along the longitudinal axis of the leg, (ii) is arranged in heat-conducting relation with the leg, (iii) is resiliently biased toward the leg by longitudinal spring means to place the leg under longitudinal compression, and (iv) has a first substantially flat side surface disposed flat against the first substantially flat side surface of the recess; and c. biasing means laterally pressing the follower into heat-conductive contact with the heat-dissipating member at said substantially flat surfaces.

By pressing a flat-sided follower laterally against a flat side surface of the heat-dissipating member, excellent thermal contact is provided between the follower and heat-dissipating member. Further, fabrication costs are reduced below the costs of preparing coaxial cylindrical surfaces within close tolerances. And the invention permits a higher density of thermoelectric legs per unit of area than when cylindrical followers and recesses are used. To achieve increased packing density, two or more followers may be placed in each recess, with one follower pressed against the side surface of the recess and the second follower pressed against the first follower. Increased density is particularly useful in the preparation of compact, high-voltage, low-power thermoelectric generators, which use a large number of thermoelectric legs connected in series to generate the desired voltage.

DETAILED DESCRIPTION

Figures 1, 2, 3, 4:
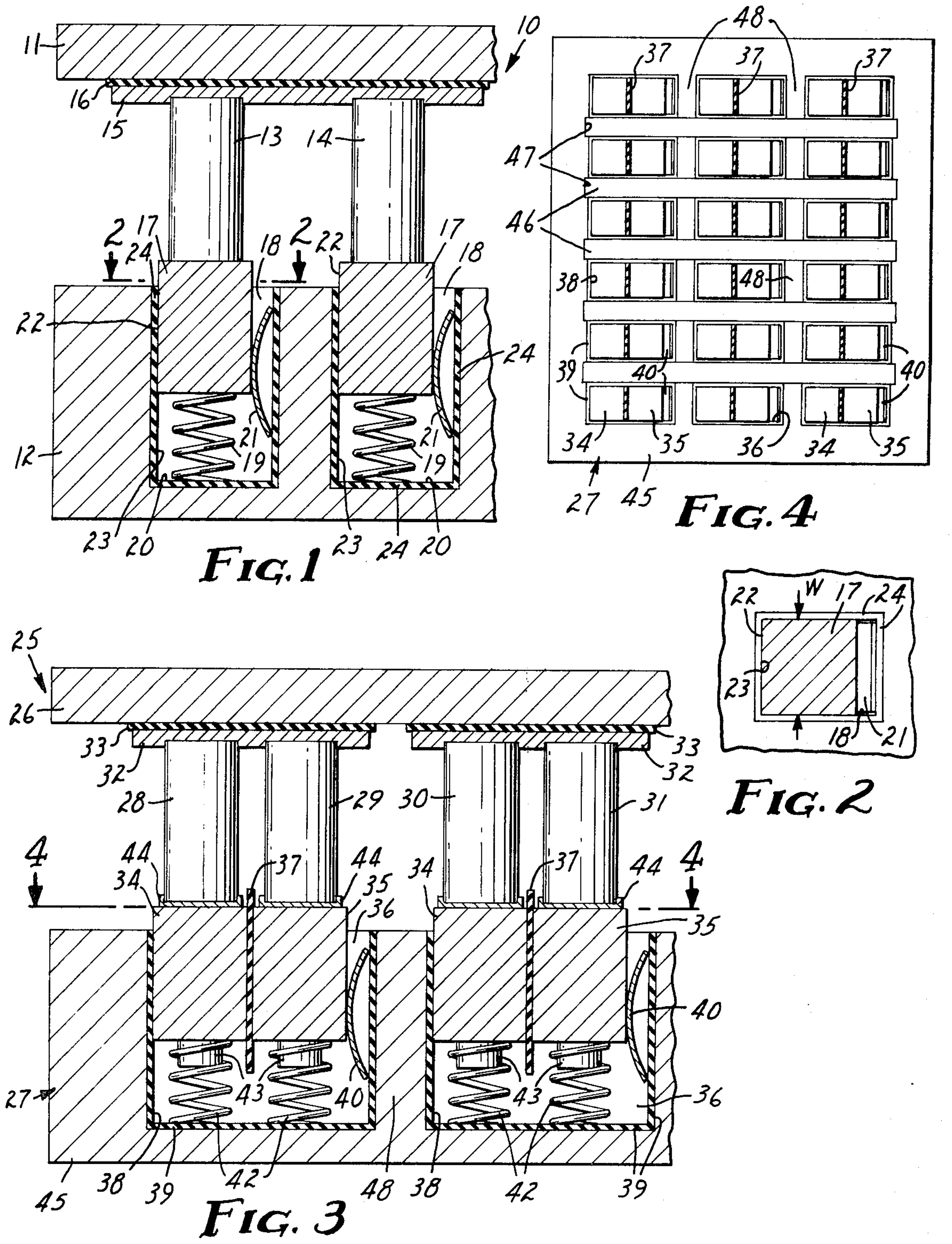
FIG. 1 is a sectional elevational view of part of a thermoelectric generator of the invention, with parts of the generator shown out of proportion for ease of illustration.
FIG. 2 is a fragmentary sectional view along the line 2—2 of FIG. 1.
FIG. 3 is a sectional elevational view of part of a thermoelectric generator of this invention.
FIG. 4 is a sectional view in reduced scale of the generator of FIG. 3 along the lines 4—4 of FIG. 3.

The thermoelectric generator 10 illustrated in FIG. 1 includes a heat-absorbing member 11, a heat-dissipating member 12, and an array of thermoelectric legs that includes legs 13 and 14. A heat source (not illustrated) is disposed above the heat-absorbing member 11 in FIG. 1, while additional heat-dissipating structure, such as metal fins, may be attached to the heat-dissipating member 12. The hot-junction means for the generator includes an electrically conductive strap 15 which is in heat-conductive contact with the heat-absorbing member 11 but is electrically insulated from it by a thin layer 16 of electrically insulating and thermally conducting material, such as a sheet of mica, boron nitride, or high-purity alumina.

The cold-junction means includes follower members 17, which are each mounted within a recess 18 formed in the heat-dissipating member 12. The thermoelectric legs may be metallurgically bonded or pressure-engaged to their cold-end follower. Each follower is coaxial with the longitudinal axis of its thermoelectric leg, 13 or 14, and a coil spring 19 is in compression between each follower and the bottom wall 20 of the recess 18, resiliently urging the follower 17 and leg toward the strap 15.

The followers 17 in this illustrative embodiment are rectangular parallelepipeds and, in horizontal cross-section as shown in FIG. 2, are square. The followers do not have to be square in cross-section, though greater packing density is obtained when they are square. The recesses 18 are generally only slightly larger in horizontal cross-section than the follower. Preferably, the width of the recess 18 (the dimension W in FIG. 2) is only a few mils greater than the width of the follower, so that the follower is guided rather precisely within the recess. A leaf spring 21 biases a first side surface 22 of the follower 17 into heat-conductive contact with a first side surface 23 of the recess 18. (The leaf spring ordinarily will not occupy as great a part of the width of the recess 18 as illustrated, the proportions in the drawing being chosen for ease of illustration.) Either or both the surface 22 of the follower and the wall of the heat-dissipating member that defines the surface 23 of the recess (as well generally as the other surfaces of the follower or recess) should be covered with a thin layer of material that electrically insulates the follower from the heat-dissipating member but will thermally connect the two. In the illustrated embodiment thin sheets 24 of mica cover the walls of the heat-dissipating member, and a sheet of mica 24 forms the surface 23 of the recess against which the follower is pressed.

The leaf spring 21, which may be formed of a thin sheet of metal that resists high temperatures such as copper or stainless steel, is arranged to assure a large-area contact between the surface 22 of the follower and the surface 23 of the recess. Instead of a leaf spring, the biasing means may take other forms; for example, in some embodiments of the invention both the longitudinal and lateral pressure are provided by a single spring acting on the bottom of the follower but directed at an angle of 20°–30° to the longitudinal axis of the follower and leg.

FIG. 3 shows a different embodiment of the invention in which thermoelectric legs are arranged at a greater density per unit of cross-section area of the generator. The thermoelectric generator 25 shown in FIG. 3 includes a heat-absorbing member 26, a heat-dissipating member 27, and an array of thermoelectric legs including the legs 28–31. An electrically conductive strap 32 joins each pair of legs in a thermocouple and is separated from the heat-absorbing member 26 by a layer 33 of electrically insulating but thermally conductive material. Again, the cold-junction means includes rectangular parallelepiped followers having a square horizontal cross-section, but in this embodiment a pair of followers 34 and 35 are located in each recess 36. The followers of a pair are separated from one another by a thin layer 37 of electrically insulating but thermally conductive material, and the side surface 38 of each recess is formed by a thin layer 39 of electrically insulating but thermally conductive material, which extends over the other walls of the recess. A leaf spring 40 biases the followers into heat-conductive contact with one another and biases the follower 34 into heat-conductive contact with the side surface 38.

A coil spring 42 engaged over a cylindrical extension 43 on the end of each follower resiliently urges the followers toward the straps 32 to place the legs under longitudinal compression. As shown by the illustrative embodiment of FIG. 3, the followers need not directly contact the leg, though they remain in heat-conducting relation with the leg. Instead an electrode member 44 may be disposed between the leg and the follower, because, for example, it may be more compatible with the material of the leg.

FIG. 4 shows the overall pattern of the followers in the generator 25 illustrated in FIG. 3. As shown, the heat-dissipating member 27 comprises a shell 45 and plates 46 which fit in grooves 47 at the side of the shell and in slots in cross members 48 to form the separate recesses 36. Converters of the invention permit a greater density of thermoelectric legs because they permit followers to be placed almost in physical contact with one another, separated only by a thin layer of electrically insulative, thermally conductive material. Further improvements in density may be achieved by placing more than two followers in a single recess, but more control over the followers and legs and the pressure they apply on thermoelectric legs is achieved when the number of followers in a recess is limited to two.

Although rectangular followers are preferred because they permit the greatest density of thermoelectric legs, followers of the invention may also simply have one or two substantially flat faces adapted to contact a mating substantially flat surface of recess.

As previously indicated, a major use for the present invention is in compact, high-voltage, low-power thermoelectric generators. For example, the generator may use thermoelectric legs on the order of 0.1 inch in diameter or less and having L/A ratios (ratio of length to cross-sectional area) on the order of 10 or more. The legs may be square in cross-section to increase compactness. In one illustrative embodiment such a generator may be made as a cylinder 2 inches in diameter and 3 inches long, having an outside cylindrical case of stainless steel, beryllium, magnesium, etc., a half-inch-thick ring of heat insulation around the inside of the case, and a disc-shaped heat source at the center of the cylinder. A bank of 60 thermoelectric legs (30 couples) may be positioned on each side of the heat source, the longitudinal axis of the legs being parallel to the axis of the cylinder and the legs being pressed toward the heat source by square followers of the invention.

As another illustration of a generator using narrow elongated thermoelectric legs, a generator was prepared as follows: An N-type leg which had a diameter of 0.075 inch and a length of 0.143 inch, was prepared by hydrostatic extrusion as taught in my copending application filed the same day as this application, Ser. No. 156,193 from lead-iodide-doped lead telluride as taught in U.S. Pat. No. 2,811,440. (Extrusion of thermoelectric legs has been found to provide thermoelectric legs of improved strength properties, as well, often, as improved thermoelectric conversion properties. In this case a cylindrical billet or slug of the described N-type lead telluride material having a cone-shaped forward end (the apex angle being 30°) and a diameter of 0.375 inch was extruded through an orifice of 0.075 inch from a first pressure chamber in which a mixture comprising two volume parts of mineral spirits and eight volume parts of motor oil at approximately 20 kilobars of pressure surrounded the billet except for the forward end engaged against the die into a second pressure chamber filled with the mixture of kerosene and oil at a pressure of approximately 10 kilobars.) The P-type leg, which had a diameter of 0.070 inch and a length of 0.143 inch, was cast from a composition including about 65.7 atomic percent copper, about 1 atomic percent silver, and about 33.3 atomic percent selenium. The cold end of the N-type leg was bonded to a 0.075-inch-diameter cylindrical nickel disc and the cold end of the P-type leg was bonded to a 0.070-inch-diameter cylindrical disc of a copper-silver eutectic solder. Copper followers having a cross-section 0.125 inch square and slidably mounted in individual recesses with a leaf spring pressing the followers laterally against a flat side surface of the recess were pressed longitudinally against the cold end of the legs, urging the hot end of both legs into pressure-engagement with a single molybdenum strap. When operated at a hot-junction temperature of 1,000°F and a cold-junction temperature of 300°F., this generator initially delivered 0.0678 volt at a current of 0.72 ampere, giving a device resistance of 0.0673 ohm and a power delivered of 0.0171 watt. After 770 hours of operation, the resistance of the device decreased to 0.0544 ohm, and the power delivered was 0.0217 watt.

What is claimed is:

1. A thermoelectric converter comprising 1. a heat-absorbing member and a heat-dissipating member in generally parallel spaced relationship;
2. an array of thermoelectric legs between said two members; and
3. hot- and cold-junction means
   a. thermally connecting the legs to, while electrically insulating them from, the heat-absorbing and heat-dissipating members, and
   b. electrically connecting the legs to accumulate the electric potential developed in the legs;

the cold-junction means for at least one leg including a. a recess in the heat-dissipating member having a first substantially flat side surface that is substantially parallel to the longitudinal axis of the leg, b. a follower member that (i) is slidably mounted in the recess for movement coaxial with the longitudinal axis of the leg, (ii) is arranged in heat-conducting relation with the leg, (iii) is resiliently biased toward the leg by longitudinal spring means to place the leg under longitudinal compression, and (iv) has a first substantially flat side surface disposed flat against the first side surface of the recess; and c. biasing means pressing the follower member laterally into heat-conductive contact with the heat-dissipating member at said surfaces.

2. A converter of claim 1 in which the biasing means is a leaf spring placed between a second surface of the follower member and a second surface of the recess.

3. A converter of claim 1 in which at least two follower members are positioned side-by-side in said recess in alignment with different thermoelectric legs, a first of the follower members being as described in claim 1, and a second follower member being pressed into heat-conductive contact with the first follower member by the biasing means, the two follower members being electrically insulated from one another.

4. A converter of claim 1 in which the follower members are square in cross-section.

5. A converter of claim 4 in which the thermoelectric legs are square in cross-section.

6. A thermoelectric converter comprising 1. a heat-absorbing member and a heat-dissipating member in generally parallel spaced relationship;
2. an array of thermoelectric legs on the order of 0.1 inch in diameter or less and having L/A ratios on the order of 10 or greater between said two members; and
3. hot- and cold-junction means
   a. thermally connecting the legs to, while electrically insulating them from, the heat-absorbing and heat-dissipating members, and
   b. electrically connecting the legs to accumulate the electric potential developed in the legs;

the cold-junction means for at least one leg including a. a recess in the heat-dissipating member that is square in cross-section with substantially flat side surfaces that are substantially parallel to the longitudinal axis of the leg, b. a follower member that (i) is slidably mounted in the recess for movement coaxial with the longitudinal axis of the leg, (ii) is arranged in heat-conducting relation with the leg, (iii) is resiliently biased toward the leg by longitudinal spring means to place the leg under longitudinal compression, and (iv) is square in cross-section with a first substantially flat side surface disposed flat against a side surface of the recess; and c. biasing means pressing the follower member laterally into heat-conductive contact with the heat-dissipating member at said surfaces.

7. A thermoelectric converter of claim 6 in which at least two follower members are positioned side-by-side in said recess in alignment with different thermoelectric legs, a first of the follower members being as described in claim 1, and a second follower member being pressed into heat-conductive contact with the first follower member by the biasing means, the two follower members being electrically insulated from one another.

* * * * *